United States Patent
Rutkowski et al.

[11] Patent Number: 5,808,457
[45] Date of Patent: Sep. 15, 1998

[54] TRANSISTOR OVERLOAD PROTECTION ASSEMBLY AND METHOD WITH TIME-VARYING POWER SOURCE

[75] Inventors: David Rutkowski, Grosse Ile; Richard Cherry, Orchard Lake; Hassan Arghavani, West Bloomfield, all of Mich.

[73] Assignee: Ford Motor Company, Dearborn, Mich.

[21] Appl. No.: 786,942

[22] Filed: Jan. 23, 1997

[51] Int. Cl.⁶ .............................. G05F 1/565; H02H 7/20
[52] U.S. Cl. ............................................. 323/282; 323/284
[58] Field of Search .................................. 323/282, 283, 323/284, 285

[56] References Cited

U.S. PATENT DOCUMENTS

| | | | |
|---|---|---|---|
| 3,855,520 | 12/1974 | Stich | 323/283 |
| 3,946,280 | 3/1976 | Quist | 361/88 |
| 4,378,580 | 3/1983 | Stich | 323/284 |
| 4,752,864 | 6/1988 | Clappier | 363/86 |
| 5,448,155 | 9/1995 | Jutras | 323/285 |

*Primary Examiner*—Peter S. Wong
*Assistant Examiner*—Bao Q. Vu
*Attorney, Agent, or Firm*—Peter Abolins, Esq.; Roger L. May, Esq.

[57] ABSTRACT

An overload protection assembly and method for overload protection of a transistor includes a switching transistor connected between a load at a first terminal and a power source at a second terminal. A measuring circuit measures the voltage levels at the first and second terminals. The first terminal is measured before and after the measurement of the second terminal, and averaged to produce its voltage level. The measured voltage levels from the first and second terminals are subtracted from one another and the difference compared to preset limits to determine overload conditions. If overload conditions exist, the measuring circuit turns off the transistor.

15 Claims, 1 Drawing Sheet

TRANSISTOR OVERLOAD PROTECTION ASSEMBLY AND METHOD WITH TIME-VARYING POWER SOURCE

BACKGROUND OF THE INVENTION

1. Field of the Invention

The present invention relates generally to overload protection circuits for automotive vehicles, and more specifically to overload protection circuits for protecting switching transistors due to inoperative loads or short circuits used in automotive vehicles.

2. Description of the Related Art

Automotive vehicles utilize various electronic controls for vehicle operation. Transistors that drive electronic loads in an automotive environment are subject to overloads due to inoperative actuators and/or short circuits caused by abraided harnesses. An overload is then placed on the switching transistor which many times cause them to become inoperative, requiring costly replacement.

Prior technology has used "smart" transistors which monitor the transistor current and temperature. These "smart" transistors are expensive. It has also been known to utilize a transistor base-emitter junction to monitor the output transistor drain-source voltage. When a voltage such as 0.7 volts is developed across the sensing transistor, it turns off the output transistor. This design requires a large number of parts, the threshold of the sensing transistor changes with temperature, and there is lot-to-lot variability of the threshold voltage. Thus, there is a need in the art to provide a simplified manner of protecting overload of transistors.

SUMMARY OF THE INVENTION

The present invention is an overload protection assembly including a switching transistor connected between a power source at a first transistor terminal and a load at a second transistor terminal, and having a control terminal controlling the switching transistor to on and off states. The overload protection assembly also includes a measuring circuit connected to and controlling the control terminal of the switching transistor for independently measuring a first voltage level at the first transistor terminal and a second voltage level at a second transistor terminal and for controlling the transistor to the off state when the first voltage level has a predetermined relationship with the second voltage level.

The present invention is also a method of overload protecting a switching transistor which includes the step of sensing a first voltage level at a first transistor terminal of a transistor which is connected to power. The method also includes the steps of independently sensing a second voltage level at a second transistor terminal of the transistor which is connected to a load and comparing the first and second voltage levels to at least one set limit. The method further includes the steps of controlling the switching transistor to an on or off state when the first and second voltage levels have a predetermined relationship to the set limits.

One advantage of the present invention is that an overload protection assembly is provided to avoid overload and burn out of transistors due to faulty loads or short circuits. Another advantage of the present invention is that a method is provided for an overload protection circuit for transistors in a simplified and less costly method.

Other features and advantages of the present invention will be readily appreciated as the same becomes better understood after reading the subsequent description when considered in connection with the accompanying drawings.

DESCRIPTION OF THE PREFERRED EMBODIMENT(S)

Figure 1:
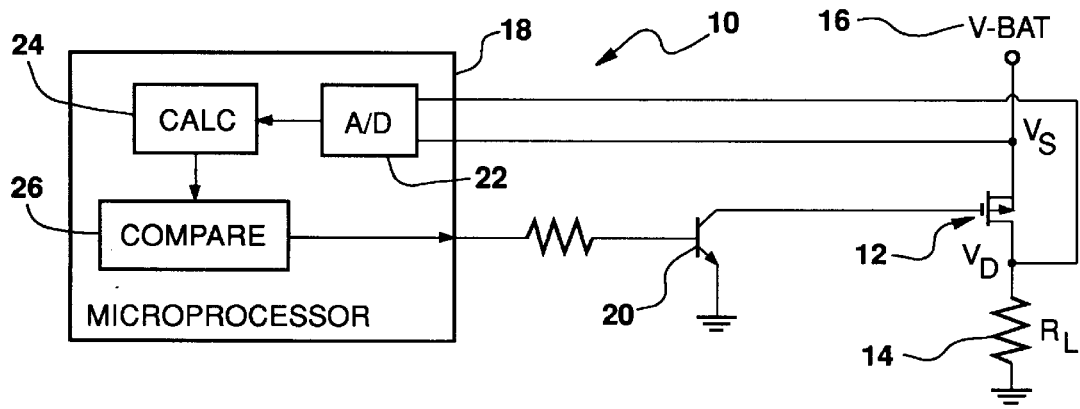
FIG. 1 is a schematic diagram of an overload protection assembly according to the present invention.

Referring to the drawings, one embodiment of an overload protection assembly 10 is generally shown in FIG. 1. The overload protection assembly 10 includes a switching transistor 12 which is connected between a load 14 at a first transistor terminal D and a power source 16 at a second transistor terminal S. The switching transistor 12 also includes a control terminal G for controlling the transistor 12 into on and off states. The overload protection assembly 10 turns the transistor 12 to the off state if one of the loads 14 becomes inoperative or a short circuit occurs. The overload protection assembly 10 is to be utilized in automotive environments, but is to be understood that other applications may exist.

A measuring circuit 18 is connected to and controls the control terminal G of the switching transistor 12 for independently measuring a first voltage level (VD) at the first transistor terminal D and a second voltage level (VS) at a second transistor terminal S. The measuring circuit 10 also controls the transistor 12 to the off state when the first voltage level (VD) has a predetermined relationship to the second voltage level (VS). The measuring circuit 18 monitors the voltage drop at the two terminals to determine whether an overload exists.

In the embodiment shown, the transistor 12 is a MOSFET having a gate as the control terminal G, a drain as the first terminal, and a source as the second terminal S. However, the transistor 12 may be a commonly available bipolar transistor with the control terminal G as the base, the first terminal S as the collector, and the second terminal D as the emmitter. Any type of switching transistor may be utilized in the subject invention and is within the scope of the teachings herein.

The switching transistor 12 also utilizes a driving transistor 20, shown for example as a bipolar transistor, which is connected between the measuring circuit 18 and the MOSFET 12.

In the embodiment shown, the measuring circuit 18 is shown as a microprocessor or microcomputer. However, it is to be understood that other dedicated circuitry may be used to perform the same functions as discussed herein. The microprocessor 18 operates under program control to perform the functions set forth in the flowchart of FIG. 2. Furthermore, the subsequent components of the measuring circuit 18 are implemented by program control.

The microprocessor 18 includes an analog to digital converter 22 for converting the first and second voltage levels (VD,VS) to a digital signal. However, as previously stated, it is possible to use all digital circuitry which would omit this function, or vice versa, analog circuitry.

The microprocessor 18 further includes a calculator 24 for subtracting the first voltage level (VD) from the second voltage level (VS) producing a voltage drop signal. The microprocessor 18 also includes a comparator 26 for comparing the voltage drop signal to a plurality of set limits to control the transistor 12 to the off state when there is a predetermined relationship to the set limits. The output of the comparator 26 drives the switching transistor 12 based on the comparison.

To protect the transistor from overloads that could be caused by an inadvertent short circuit of the output to ground, the voltage drop across the drain and source of the switching transistor 12 is measured by the measuring circuit 18. This is accomplished by independently measuring the drain voltage and the source voltage and subtracting the two readings. Because the battery supply 16 may have an alternating current component caused by induced transients, there may be an error in the calculated voltage drop across the switching transistor 12 if the two voltages are not measured at the same time. Because most microprocessors employ a single analog to digital converter and sequentially measure signals, there will be an error when subtracting readings if there is an AC component in the battery voltage. This is compensated for by the averaging of the drain voltage.

More particularly, the calculator 24 measures the drain voltage VD twice, just before and just after measuring the source voltage VS. The two measurements are then averaged and subtracted from the source voltage to compute the voltage drop (VSD). The time increment between measurements is kept small (relative to the frequency of the sinusoidal component) and equal. The two measurements of the drain voltage VD are taken before and after the source voltage to compensate for any sinusoidal component in the battery voltage. In the worst case, the measurements are made when the rate of change is the greatest in the sinusoidal component of the battery voltage, e.g. at the inflection point. For illustration, assume there is no current flow and VSD equals zero. The first measurement of VD1 is averaged with the second measurement VD2. The average is very close to VS, hence the calculated difference between the two is zero. If either VD1 or VD2 is used alone, the difference between the two is not zero and an error results. This error increases when amplitude of the AC component of the battery voltage and time between measurements. Both of these influences are compensated for in this invention. Furthermore, the measurements are made with an equal time interval between each measurement.

Figure 2:
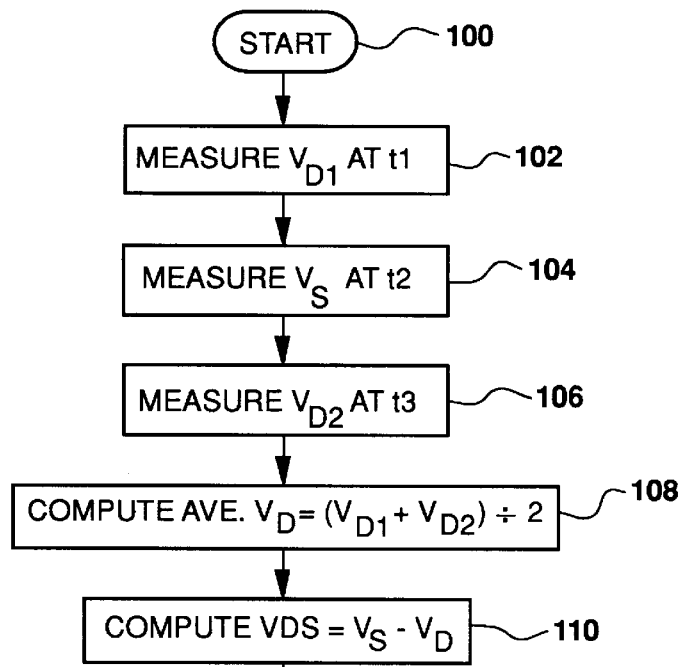
FIG. 2 is a flowchart of a method, according to the present invention, used in conjunction with the overload protection assembly of FIG. 1.
Figure 2:
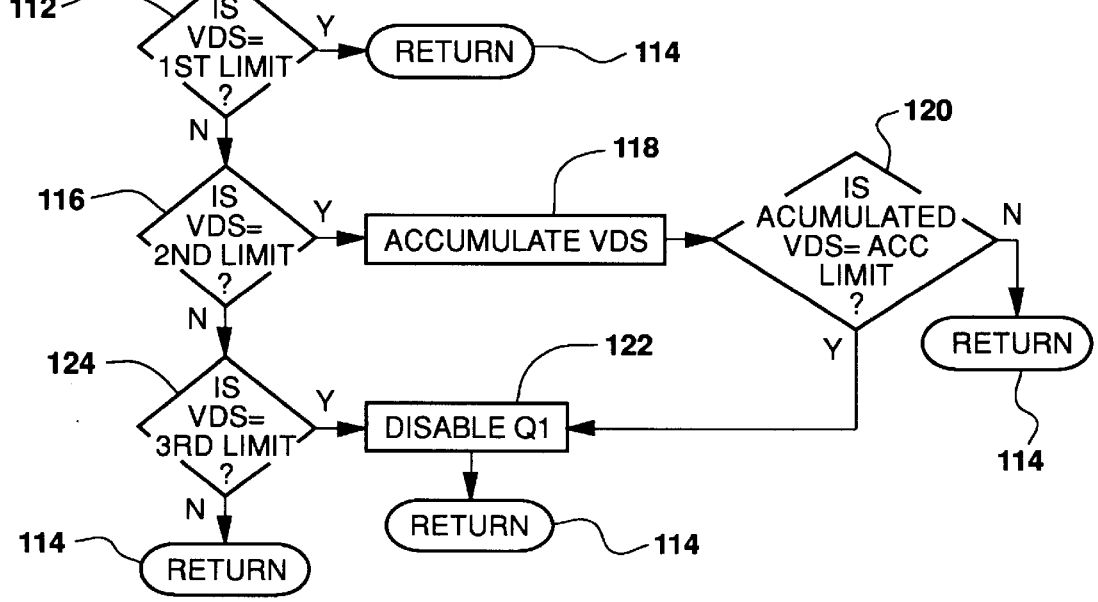

The flowchart of the microprocessor 18 is illustrated in FIG. 2. The program starts in block 100, and the first step is to measure the drain voltage at a first time interval $t_1$ in block 102. The second measurement is of the source voltage at the second time interval $t_2$ in block 104. Again the drain voltage is measured at time $t_3$ in block 106. The average drain voltage is computed by adding VD1 plus VD2 divided by two in block 108. Thereafter, the voltage drop VDS is computed by subtracting the average drain voltage from the source voltage in block 110. This voltage drop (VDS) is compared to a plurality of set limits. If VDS is within a first limit of counts, the output is within limits and no action is required in block 102. Therefore, the program returns to start in block 114. If the voltage drop VDS is within a second limit of counts in block 116, there is a small overload which is occurring and the drain voltage counts are accumulated in block 118. When the accumulated value is greater than an accumulated limit in block 120, an overload exists and the switching transistor 12 is turned off in block 122. Lastly, the voltage drop VDS is compared to determined if within a third limit of counts in block 124. In this case, there is a large overload detected and the transistor is immediately turned off in block 122.

The actual count values utilized in the invention depend on the hardware actually utilized and testing for necessary limits. In a preferred embodiment, the first limit was determined to be 0–12 counts, the second limit was determined to be 13–24 counts, the accumulated limit was determined to be 250 counts, and the third limit was determined to be greater than 25 counts. However, these counts may change depending on the exact design. It is also to be understood that the measurements and calculations utilizing the source and the drain values may be switched, i.e., the source may be measured twice about the drain, etc.

Also included is a method of overload protecting a switching transistor 12. The method includes the step of sensing a first voltage level (VD) at a first transistor terminal D of a transistor which is connected to power. The method also includes the step of independently sensing a second voltage level (VS) at a second transistor terminals of the transistor which is connected to a load. The method also includes the step of comparing the first (VD) and second (VS) voltage levels to at least one set limit, and controlling the switching transistor 12 to on or off states when the first and second voltage levels have a predetermined relationship to the set limits. Furthermore, the method includes the steps of sensing a first drain voltage level (VD1), sensing a source voltage level (VS), and sensing a second drain voltage level (VD2). The method also includes averaging the first and second drain voltage levels to obtain an average drain voltage level, and subtracting the averaged drain voltage level from the source voltage level to obtain a voltage drop signal, and comparing the voltage drop signal to a plurality of set limits to control the switching transistor 12.

The present invention has been described in an illustrative manner. It is to be understood that the terminology which has been used is intended to be in the nature of words of description rather than of limitation.

Many modifications and variations of the present invention are possible in light of the above teachings. Therefore, within the scope of the appended claims, the present invention may be practiced other than as specifically described.

What is claimed is:

1. An overload protection assembly comprising:

a switching transistor connected between a load at a first transistor terminal and a power source at a second transistor terminal, and having a control terminal controlling said transistor to on and off states; and a measuring circuit connected to and controlling said control terminal of said switching transistor for independently measuring a first voltage level at said first transistor terminal and a second voltage level at said second transistor terminal and for controlling said switching transistor to the off state when said first voltage level has a predetermined relationship to said second voltage level, said measuring circuit including a calculator for subtracting said first voltage level from said second voltage level for producing a voltage drop signal;

said measuring circuit includes a comparator for comparing said voltage drop signal to a plurality of set limits to control said transistor to the off state when there is a predetermined relationship to said set limits, said set limits including a first set limit allowing continued operation of said switching transistor, a third set limit immediately controlling said transistor to said off state, and a second set limit which accumulate the voltage drop signals overtime and compare to an accumulated limit to control said transistor to the off state upon determining a predetermined relationship to the accumulated limit.

2. An overload protection assembly as set forth in claim 1 wherein said switching transistor includes a MOSFET having a gate as said control terminal, a drain as said first terminal and a source as said second terminal.

3. An overload protection assembly as set forth in claim 1 wherein said measuring circuit includes an analog-to-digital converter for converting said first and second voltage levels to a digital signal to said calculator.

4. An overload protection assembly as set forth in claim 3 wherein said measuring circuit comprises a microprocessor.

5. An overload protection assembly as set forth in claim 2 wherein said switching transistor includes a driving transistor connected between said measuring circuit and said MOSFET.

6. An overload protection assembly comprising:

a switching transistor connected between a load at a first transistor terminal and a power source at a second transistor terminal, and having a control terminal controlling said switching transistor into on and off states;

a measuring circuit connected to and controlling said control terminal of said switching transistor for independently measuring a first voltage level at said first transistor terminal and a second voltage level at said second transistor terminal and for controlling said switching transistor to the off state when said first voltage level has a predetermined relationship to said second voltage level; and said measuring circuit including a calculator circuit for measuring a first initial voltage level at said first transistor terminal at a first time prior to measuring said second voltage level at a second time greater than said first time, and measuring a second initial voltage level at said first transistor terminal at a third time after measuring said second voltage level, and averaging the first and second initial voltage levels to produce said first voltage level.

7. A method of overload protecting a switching transistor comprising the steps of:

sensing a first voltage level at a first transistor terminal of a transistor which is connected to power;

independently sensing a second voltage level at a second transistor terminal of the transistor which is connected to a load;

sensing a first initial voltage level at the first transistor terminal prior to sensing the second voltage level, and sensing a second initial voltage level at the first transistor terminal after sensing the second voltage level;

averaging the first and second initial voltage levels to obtain the first voltage level;

comparing the first and second voltage levels to at least one set limit; and controlling the transistor to an on or off state when the first and second voltage levels have a predetermined relationship to the set limits.

8. A method as set forth in claim 7 further including sensing the first and second initial voltage levels and the second voltage level at equal time intervals.

9. A method as set forth in claim 7 including subtracting the averaged first voltage level from the second voltage level to obtain a voltage drop signal.

10. A method as set forth in claim 9 including comparing the voltage drop signal to a plurality of set limits to control the transistor.

11. A method as set forth in claim 7 including the transistor comprising a MOSFET having a drain as the first transistor terminal and a source as the second is transistor terminal.

12. A method as set forth in claim 7 including the transistor comprising a bipolar transistor having a collector as the first transistor terminal and a emmitter as the second transistor terminal.

13. A method as set forth in claim 10 including allowing said transistor to remain in said on state when said voltage drop signal is within a first set of limits.

14. A method as set forth in claim 13 including switching said transistor to said off state when said voltage drop signal is within a second set of limits and an accumulated amount of voltage drop signals within a time has a predetermined relationship to an accumulated limit.

15. A method as set forth in claim 14 including immediately switching said transistor to said off state when said voltage drop signal is within a third set of limits.

* * * * *